US006341408B2

(12) United States Patent
Bureau et al.

(10) Patent No.: US 6,341,408 B2
(45) Date of Patent: *Jan. 29, 2002

(54) METHOD OF MANUFACTURING A MULTIPLE-ELEMENT ACOUSTIC PROBE COMPRISING A COMMON GROUND ELECTRODE

(75) Inventors: Jean-Marc Bureau, Valbonne; Jean-François Gelly, Antibes, both of (FR)

(73) Assignee: Thomson-CSF, Paris (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/117,045

(22) PCT Filed: Nov. 21, 1997

(86) PCT No.: PCT/FR97/02110

§ 371 Date: Jul. 27, 1998

§ 102(e) Date: Jul. 27, 1998

(87) PCT Pub. No.: WO98/23392

PCT Pub. Date: Jun. 4, 1998

(30) Foreign Application Priority Data

Nov. 26, 1996 (FR) ........................................... 96 14472

(51) Int. Cl.[7] ................................................ H01L 41/00

(52) U.S. Cl. ...................... 29/25.35; 310/334; 310/336; 367/155

(58) Field of Search ......................... 29/25.35; 310/334, 310/336; 367/155

(56) References Cited

U.S. PATENT DOCUMENTS

| | | | | |
|---|---|---|---|---|
| 5,274,296 | A | | 12/1993 | Hiki et al. |
| 5,423,220 | A | | 6/1995 | Finsterwald et al. |
| 5,732,706 | A | | 3/1998 | White et al. |
| 5,764,596 | A | * | 6/1998 | Hanafy et al. ......... 29/25.35 X |

FOREIGN PATENT DOCUMENTS

| | | |
|---|---|---|
| EP | A 0 210 723 | 2/1987 |
| EP | A 0 707 898 | 4/1996 |
| EP | A 0 779 108 | 6/1997 |
| JP | A 57 147397 | 9/1982 |
| WO | WO A 91 11960 | 8/1991 |
| WO | WO A 97 17145 | 5/1997 |
| WO | WO A 97 34528 | 9/1997 |

* cited by examiner

*Primary Examiner*—Carl E. Hall
(74) *Attorney, Agent, or Firm*—Oblon, Spivak, McClelland, Maier & Neustadt, P.C.

(57) ABSTRACT

A method of manufacturing a multiple-element acoustic probe including piezoelectric transducers and an array of interconnections connecting the transducers to an electronic signal processing and control device. The probe also includes a continuous ground electrode integrated between the transducers and the acoustic matching elements, facing the piezoelectric transducers, the acoustic matching elements being totally uncoupled from one another mechanically. This probe may be used in medical imaging or underwater imaging.

12 Claims, 7 Drawing Sheets

METHOD OF MANUFACTURING A MULTIPLE-ELEMENT ACOUSTIC PROBE COMPRISING A COMMON GROUND ELECTRODE

BACKGROUND OF THE INVENTION

1. Field of the Invention

The field of the invention is that of acoustic transducers that can be used especially in medical or underwater imaging.

2. Discussion of the Background

In general, an acoustic probe comprises a set of piezoelectric transducers connected to an electronic control device by means of an interconnection array.

These piezoelectric transducers emit acoustic waves which, after reflection in a given medium, provide information on said medium. Generally, one or more acoustic matching plates, for example of the quarter-wave type, are attached to the surface of the piezoelectric transducers to improve the transfer of acoustic energy in said medium.

These matching plates may be made out of a polymer type material charged with mineral particles whose proportions are adjusted to obtain the desired acoustic properties. In general, these plates are shaped by moulding or machining and then joined by bonding to one of the faces of the piezoelectric transducers.

More specifically, in the case of a probe possessing a set of elementary transducers, the piezoelectric transducers are separated mechanically by a cutting up of a monolithic plate of piezoelectric material, for example PZT type ceramic. It is then also necessary to cut out the associated acoustic matching layer or layers in the same way so as to avoid any acoustic coupling between elementary transducers through this matching layer or layers. The cutting out of these matching layers and of the piezoelectric layer is therefore generally done simultaneously, for example by means of a diamond-tipped saw.

Each elementary piezoelectric transducer must be connected on the one hand to the ground and on the other hand to a positive contact (also called a hot point).

In general, the ground is located towards the propagation medium (for example the patient in the case of an acoustic echography probe), namely it should be on the side where the acoustic matching elements are positioned.

The simultaneous cutting out of acoustic matching layers and of piezoelectric material has the consequence wherein the ground electrode too is cut out when this electrode is constituted by a metal layer inserted between the acoustic matching material and the piezoelectric material. In the case of a one-dimensional array probe the continuity of the ground electrode is preserved in one direction. In the case of a two-dimensional array probe, where the elements are cut out in both directions, the continuity of the ground electrode must be preserved in at least one direction so as to enable the retrieval of the ground at the periphery of the matrix assembly of elementary piezoelectric transducers.

In the prior art, in order to preserve a continuity of the ground in the case of a two-dimensional probe, it has been proposed to proceed as follows:

On the interconnection array 1, a conductive layer is deposited and then a plate of piezoelectric material is deposited by bonding.

Successive cutting-out operations are performed, in a direction Dy illustrated in FIG. 1, on the matrix of transducers Tij. One or more acoustic matching plates are bonded in the same way. The lower face of the first acoustic matching plate is metallized, enabling the grounds to be brought to the edges of the matrix.

Finally, the entire unit (acoustic matching plates and piezoelectric material plate) are cut out in the direction Dx perpendicular to the direction Dy.

There is thus obtained a matrix of elementary piezoelectric transducers Tij covered with acoustic matching elements Ai, with ground electrodes Pi inserted between the transducers Tij and the elements Ai.

However, this method has the drawback of mechanically connecting the elementary transducers of one and the same line i in the direction Dx, and is therefore detrimental to the performance characteristics of the acoustic probe that results therefrom.

SUMMARY OF THE INVENTION

This is why the invention proposes an acoustic probe comprising a continuous ground electrode inserted between elementary piezoelectric transducers uncoupled from one another, and acoustic matching elements also uncoupled from one another so as to resolve the problem of the prior art.

More specifically, an object of the invention is an acoustic probe comprising acoustic matching elements, elementary piezoelectric transducers and an array of interconnections connecting the acoustic transducers to an electronic signal processing and control device characterized in that said probe comprises a continuous ground electrode inserted between the elementary acoustic transducers and acoustic matching elements.

The ground electrode may typically be a metal foil, for example made of copper or silver.

It may also be a metallized polymer film of the copper-plated or gold-plated polyester or polyimide type, or again a polymer film charged with conductive particles.

The acoustic matching elements may advantageously be made of epoxy resin charged with tungsten and/or aluminium oxide particles while the elementary piezoelectric transducers may be made of PZT type ceramic.

According to one variant of the invention, the acoustic probe comprises acoustic matching elements $Aij_1$, with an impedance close to that of the propagation medium of the acoustic probe, that are located above the ground electrode and acoustic matching elements $Aij_2$, with an impedance close to that of the piezoelectric transducers, that are located between the ground electrode and the piezoelectric transducers.

Typically, when the acoustic probe according to the invention is designed to work in an aqueous medium, the piezoelectric transducers being made of ceramic, the elements $Aij_1$ have an impedance of about 2 to 3 Mega Rayleigh and the elements $Aij_2$ have an impedance of about 8 to 9 Mega Rayleigh.

An object of the invention is also a method for the manufacture of the acoustic probe according to the invention. This method comprises the making of elementary piezoelectric transducers (Tij) on the surface of an array of interconnections connecting the acoustic transducers to an electronic signal processing and control device characterized in that it furthermore comprises the following steps:

- the depositing of a conductive layer that constitutes an ground electrode (P) on the surface of the elementary transducers (Tij);
- the depositing of at least one layer of acoustic matching material;
- the selective etching of the layer or layers of acoustic matching materials with a corrosion barrier on the conductive layer so as to constitute acoustic matching elements (Aij).

Advantageously, the selective etching may be done by a $CO_2$ type laser, an excimer type ultraviolet laser or else a YAG type laser.

According to one method of manufacture of the acoustic probe of the invention, the ground electrode may be a metallized copper-coated polyimide film, and the acoustic matching elements Aij may then be defined by the etching, with a $CO_2$ laser at an energy density in the range of some Joules per $cm^2$ (so as not to corrode the metallization), of a layer of epoxy resin charged with tungsten particles.

According to one variant of the method of the invention, two layers of acoustic matching material are deposited, a first layer having an impedance close to that of the piezoelectric transducers and a second layer having an impedance close to that of the medium in which the acoustic probe is designed to function. The set of two layers is etched with a corrosion barrier on the conductive layer.

According to another variant of the invention, a layer that has impedance close to that of the transducers and is conductive is deposited on the surface of a layer of piezoelectric material, the unit is cut out so as to define the piezoelectric transducers Tij and a first series of high-impedance acoustic matching elements. A conductive ground electrode layer is deposited on the set of transducers Tij covered with the elements $Aij_1$. A second acoustic matching layer is placed on the surface of the ground electrode P, elements $Aij_2$ are then defined by the selective cutting out of the low-impedance layer with an etching barrier on the ground electrode.

BRIEF DESCRIPTION OF THE DRAWING

The invention will be understood more clearly and other advantages shall appear from the following description, given on an non-restrictive basis and with reference to the appended figures, of which.

DETAILED DESCRIPTION OF THE PREFERRED EMBODIMENT

The acoustic probe according to the invention comprises elementary piezoelectric transducers Tij (organized in a linear matrix or in a way that is preferably two-dimensional), attached to a matrix of facing interconnection pins. This matrix of interconnections is constituted by ends of metal tracks emerging on one of the faces of an array of interconnections, described hereinafter and known as a backing. The opposite ends of the metal tracks are generally connected to an electronic control and analysis device.

Figure 1:
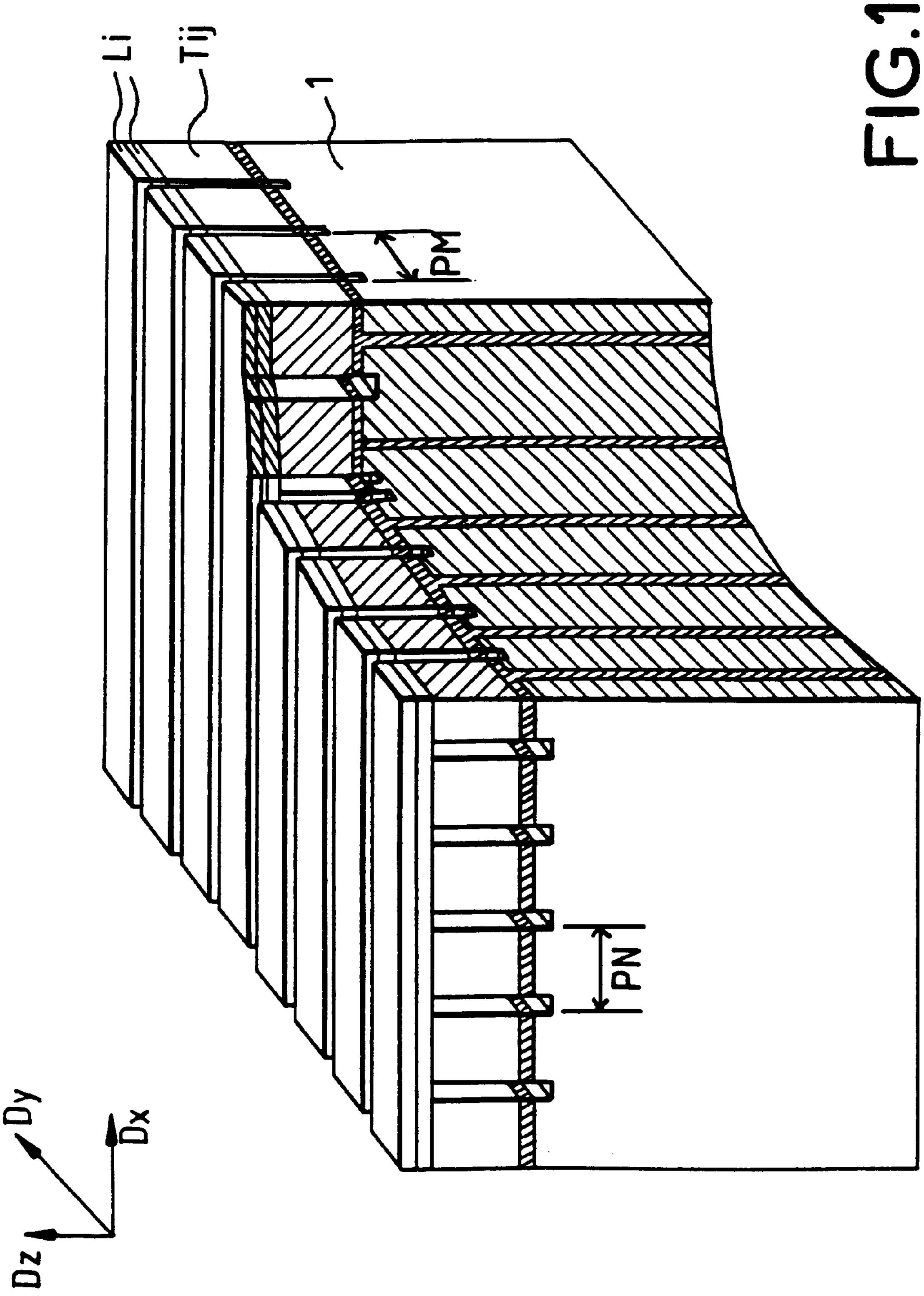
FIG. 1 illustrates an acoustic probe according to the prior art.
Figure 2:
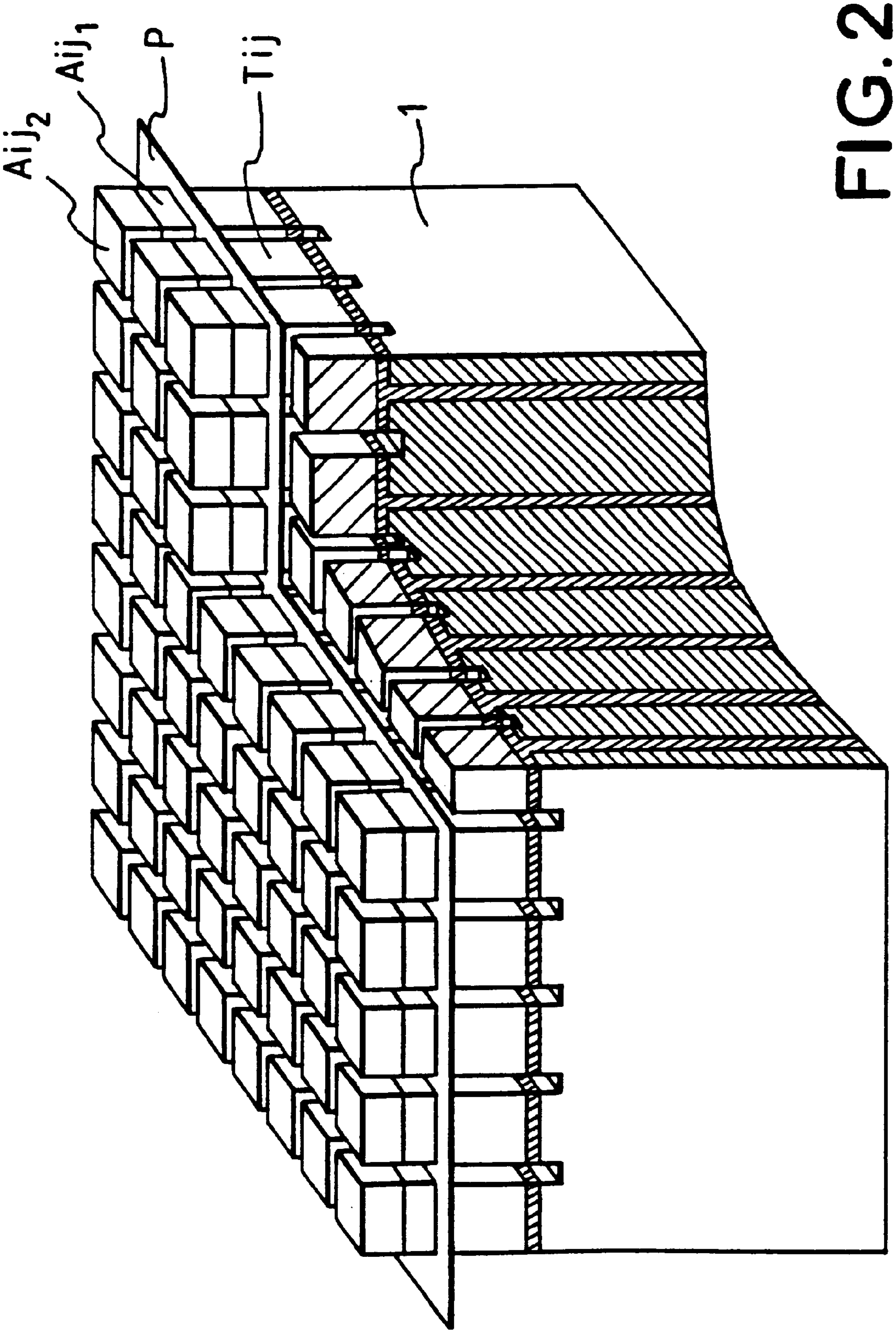
FIG. 2 illustrates a first exemplary acoustic probe according to the invention.

FIG. 2 illustrates a first exemplary acoustic probe according to the invention in which the entire probe appears to be partially cut. The backing 1 supports the elementary piezoelectric transducers Tij. A continuous ground electrode P is attached to the surface of the transducers Tij and supports the set of the discrete acoustic matching elements Aij that may result from the depositing of one or more layers of acoustic matching material (in the example of FIG. 2, two layers are shown and result in the obtaining of elements $Aij_1$ and $Aij_2$).

Figure 3:
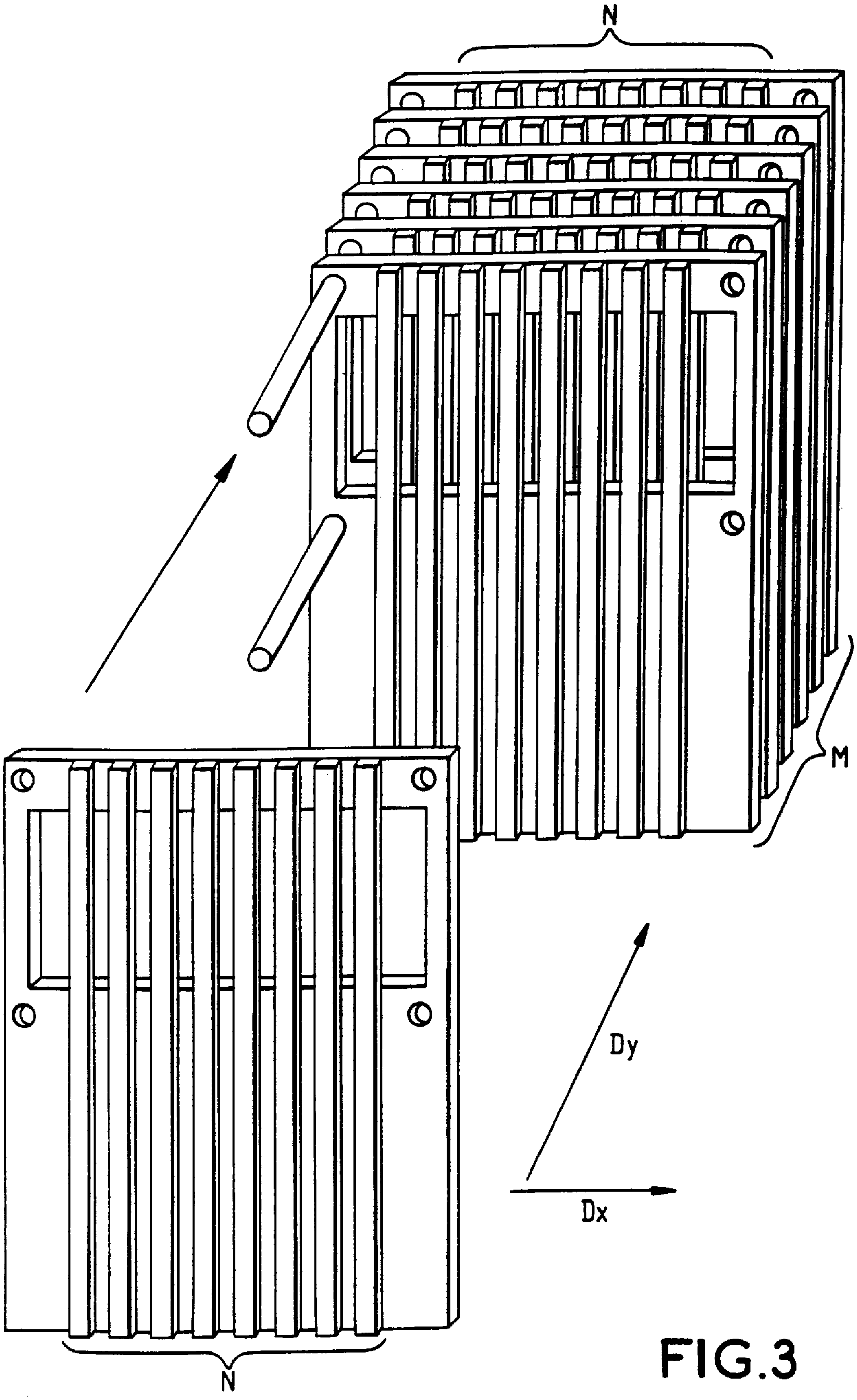
FIG. 3 illustrates a first step in the manufacture of an exemplary array of interconnections used in an acoustic probe according to the invention.

In the case of a matrix of MxN piezoelectric transducers, the array of interconnections may be made, for example, in the following way:

M dielectric substrates are used. On these substrates N conductive tracks are made along an axis Dx. Each substrate may comprise a window that locally leaves the conductive tracks bare. All the M substrates are aligned and stacked in a direction Dy. There is thus obtained a stack of M dielectric substrates, said stack having a cavity comprising MxN conductive tracks. FIG. 3 illustrates the construction of this stack.

Figure 4:
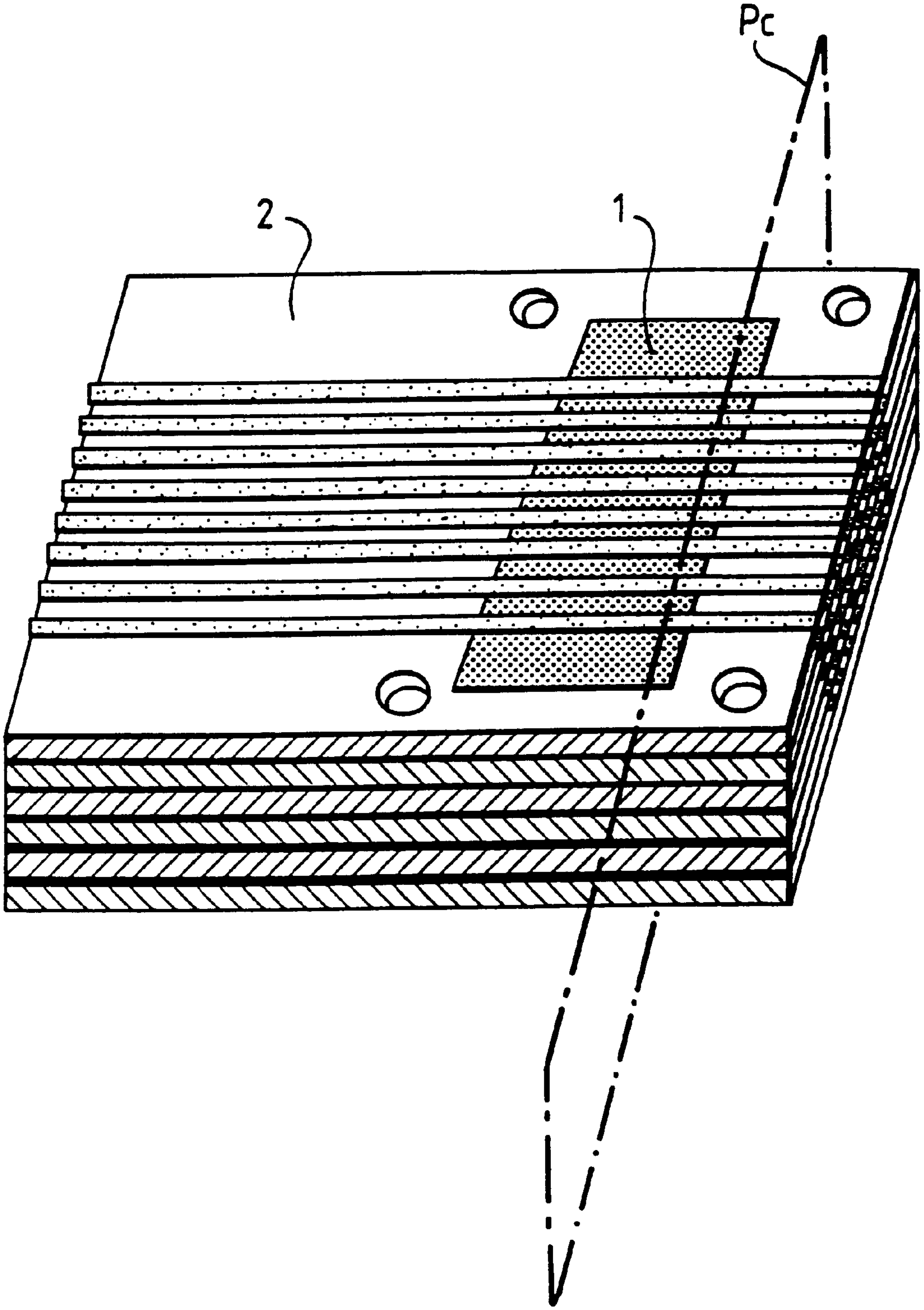
FIG. 4 illustrates a second step in the manufacture of an exemplary array of interconnections, used in an acoustic probe according to the invention.

The cavity thus formed is filled with a hardening resin that is electrically insulating and possesses the desired properties of acoustic attenuation. After the hardening of the resin, the stack is cut along a plane Pc, perpendicular to the axis of the tracks at the level of the preformed cavity as shown in FIG. 4 in order to obtain a surface consisting of MxN track sections perpendicularly flush with the resin at the level of the backing 1.

Figure 5:
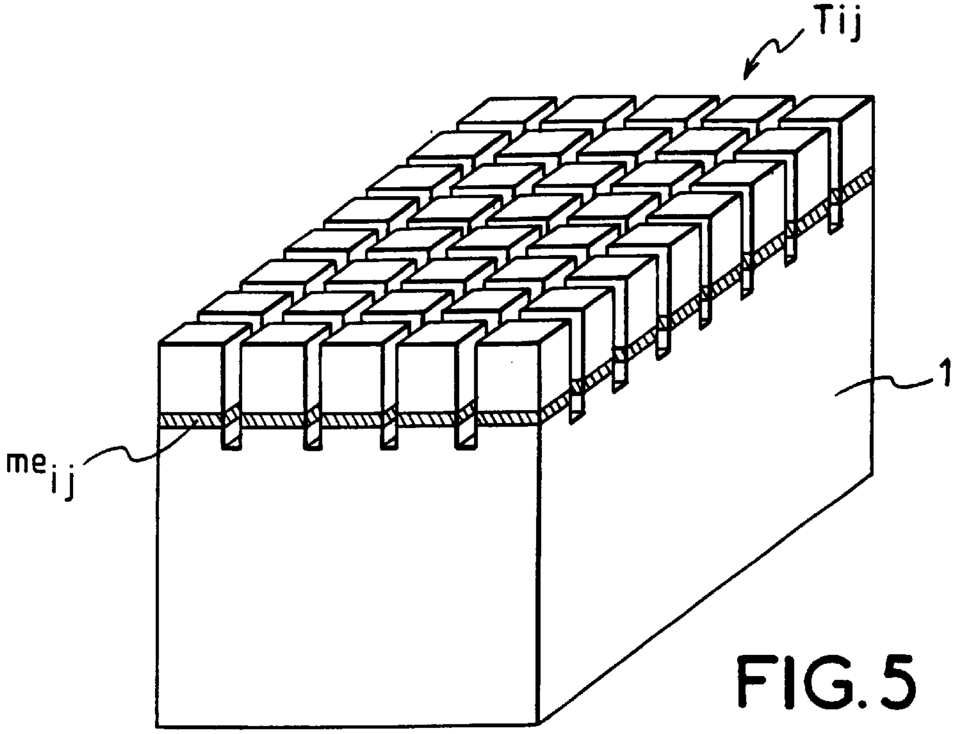
FIG. 5 illustrates a step in the method of manufacture of an acoustic probe common to the prior art and to the method of the invention.

To provide for the connection between these MxN track sections and the piezoelectric transducers Tij, it is possible advantageously to proceed as follows:

The entire surface of the backing 1 constituted by the MxN track sections is metallized with a layer Me. A layer of PZT ceramic type piezoelectric material is laid thereon. Then, the layer Me and the ceramic layer are cut out, for example by sawing, so as to define the transducers Tij that are independent of one another. The barrier against the cutting out operation can be made on the surface of the resin and the control of this etching does not require extreme precision. FIG. 5 shows the matrix of transducers Tij defined on elementary metallizations $Me_{ij}$ corresponding to the "hot point" contacts referred to here above, the assembly being thus connected electrically to the backing 1.

Figure 6:
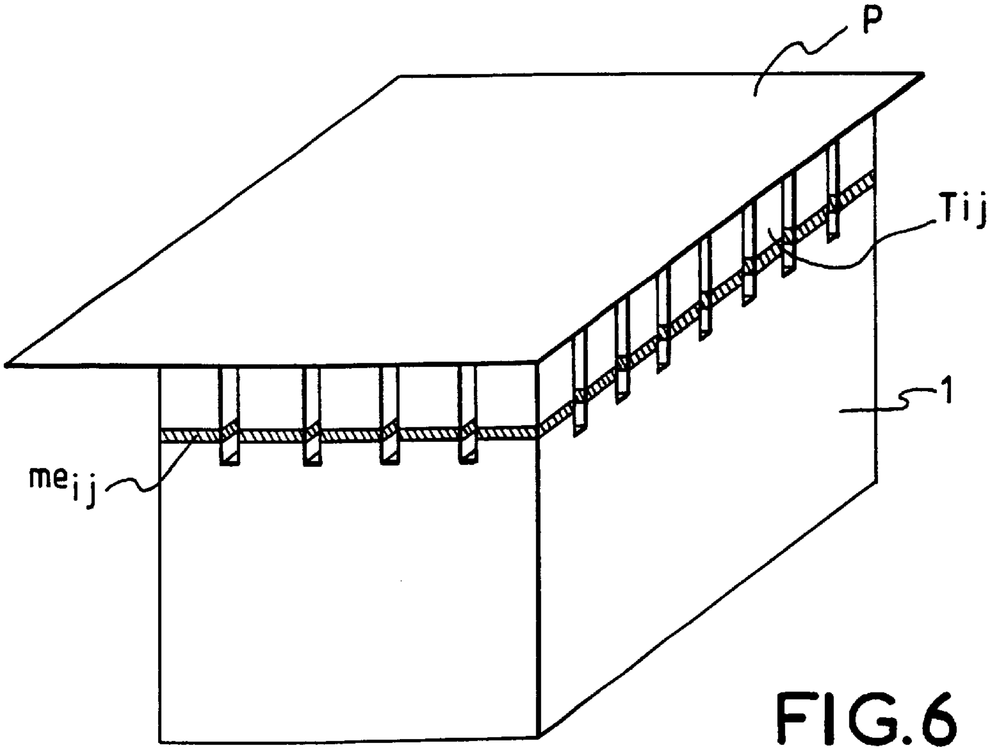
FIG. 6 illustrates a step in the method of manufacture of an acoustic probe according to the invention, comprising the depositing of a conductive layer on the surface of the elementary transducers Tij.
Figure 7:
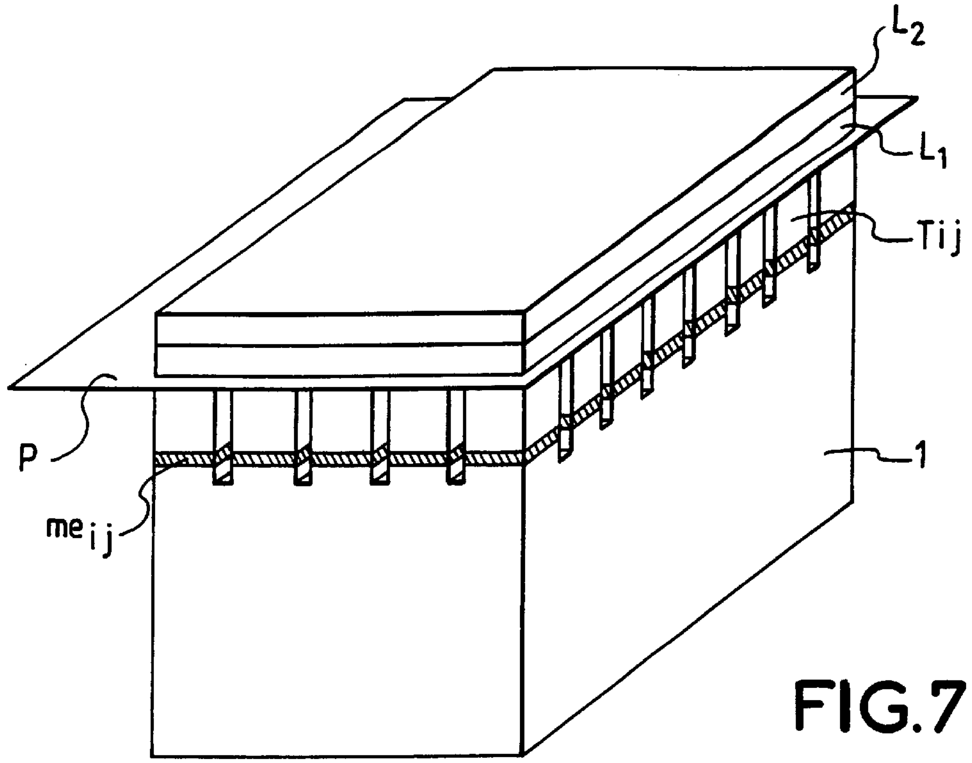
FIG. 7 illustrates a step in the method of manufacture of an acoustic probe according to the invention, comprising the depositing of acoustic matching plates.

The unit thus constituted is covered with a conductive ground electrode P as shown in FIG. 6, that is laid on and then bonded, whether it is a metal foil or a film of metallized polymer.

Figure 8:
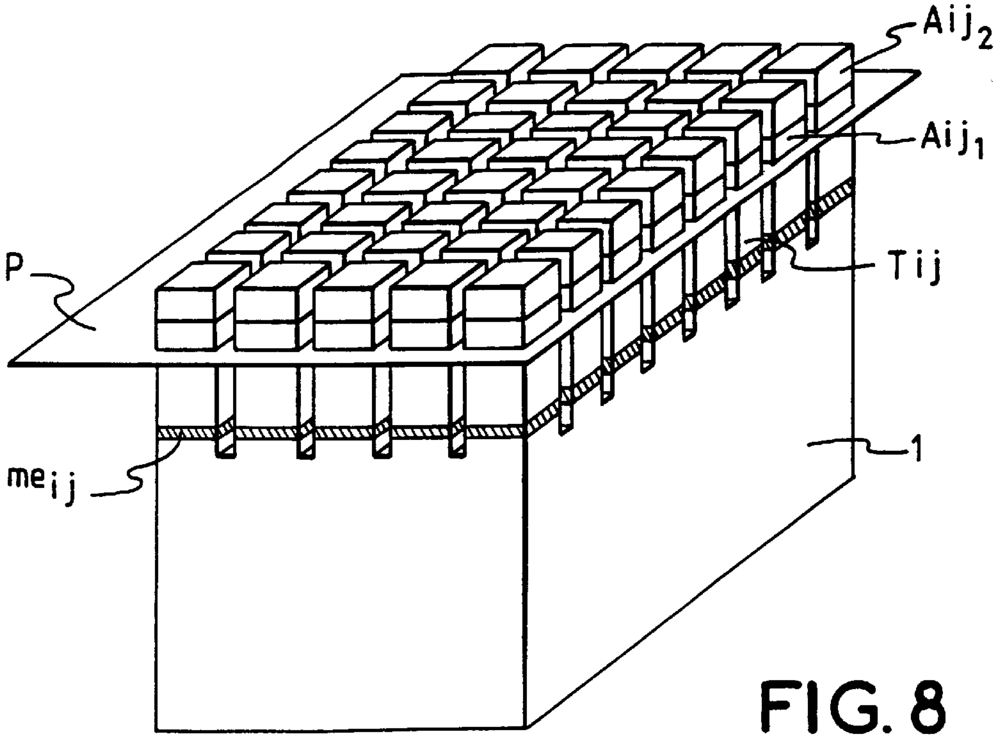
FIG. 8 illustrates a step in the method of manufacture of an acoustic probe according to the invention, comprising the selective cutting out of the acoustic matching plates so as to define the elements Aij.

Two plates of acoustic matching material L1 and L2 are then bonded as shown in FIG. 8. The first plate L1 has high impedance close to that of the material constituting the transducers, the second plate L2 has lower impedance close to that of the medium in which it is sought to use the acoustic probe. The cutting-out operation must mechanically separate the matching plates without cutting out the ground electrode P.

In this way, an acoustic decoupling of the elementary transducers Tij is obtained, at the same time as electrical continuity is kept making it possible to recover the ground contact at the periphery of the probe.

In particular, this cutting-out operation can be done by lasers. The laser used may be for example a $CO_2$ type infrared laser or an excimer type UV laser or a triple or quadruple YAG type laser.

By an appropriate choice of the different constituent elements of the ground electrodes and the acoustic matching elements, and of the parameters of the laser beam, namely wavelength and energy density, it becomes possible to carry out a selective machining of the acoustic matching plates without affecting the ground electrode. The cutting-out operation can be done by means of a laser beam focused and guided so as to describe the cuts required or again by scanning through a mask aligned on the cutting-out paths.

According to another variant of the invention, the acoustic probe has two series of acoustic matching elements $Aij_1$ and $Aij_2$ separated by the continuous ground electrode.

Figure 9:
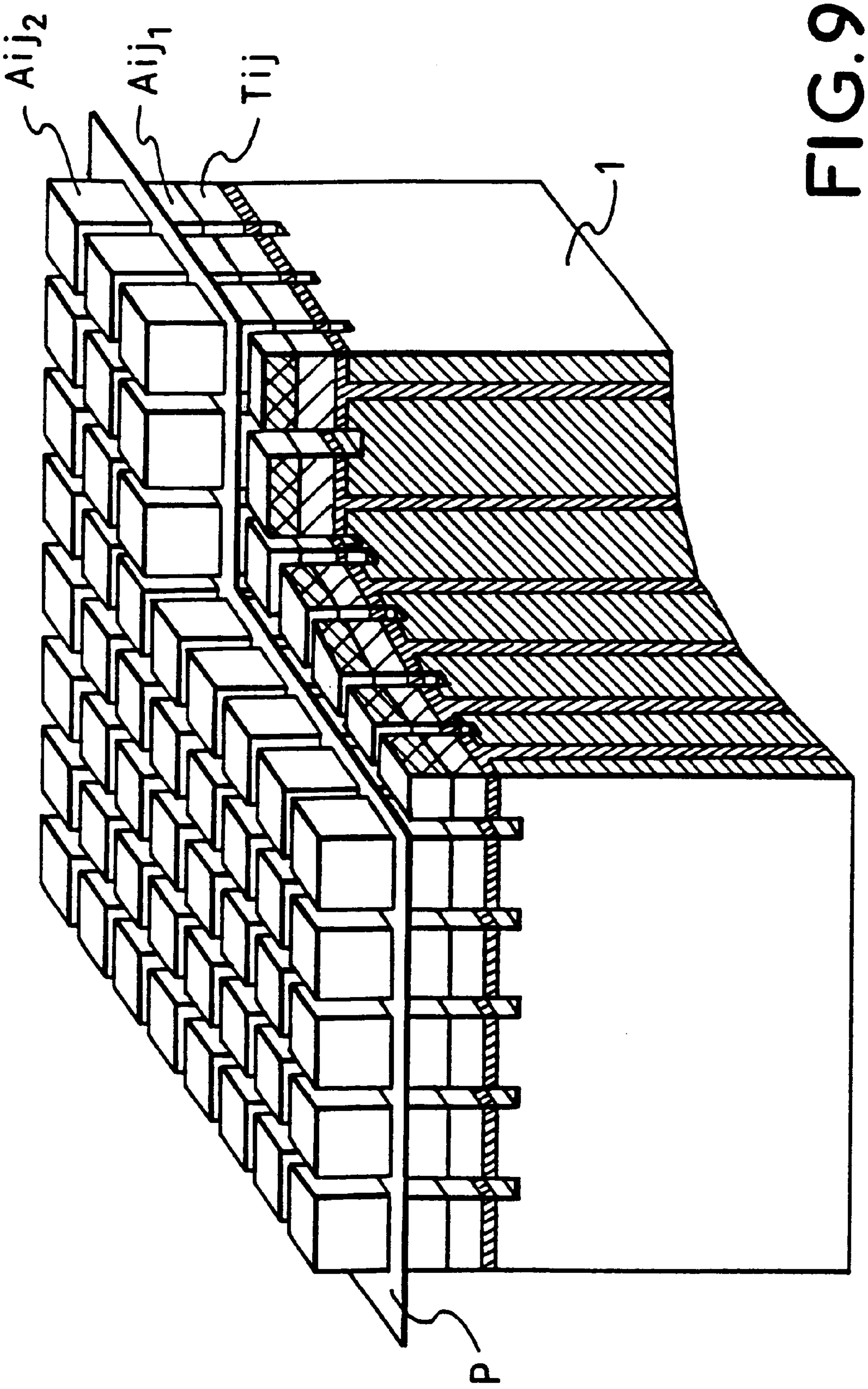
FIG. 9 illustrates a second exemplary acoustic probe according to the invention.

This probe comprises elementary transducers Tij attached to a matrix of facing interconnection pins forming part of an interconnection array. FIG. 9 illustrates this configuration. The first series of high-impedance acoustic matching elements may be defined at the same time as the piezoelectric elements through the cutting-out operation, for example by the sawing of the above-mentioned metallization layer Me, the ceramic layer (constituting the elementary transducers) and a first acoustic matching plate L1 which must be conductive.

The unit thus constituted, formed by the electrodes $Me_{ij}$, the transducers Tij, the elements $Aij_1$, is covered with a conductive ground electrode P that is laid on and then bonded.

It is then possible to bond a second low-impedance plate L2 cut out by etching, with an etching barrier, on the ground electrode so as to define the low-impedance elements $Aij_2$. One of the useful aspects of this variant of the invention lies in the fact that the thickness to be cut out by selective etching is small and, at the same time, a probe is available that advantageously has high-impedance elements and low-impedance elements.

What is claimed is:

1. A method of manufacturing a multiple-element acoustic probe, comprising the steps of:

forming an array of independent piezoelectric transducers;

laying a conductive electrode on said array;

bonding said conductive electrode to said array;

covering said conductive electrode with a first acoustic matching plate;

covering said first acoustic matching plate with a second acoustic matching plate having a lower acoustic impedance than said first acoustic matching plate; and etching said first and second acoustic matching plates so that said conductive electrode provides a corrosion barrier to said etching, wherein said etching is performed so as to form an array of acoustic matching elements corresponding to said array of independent piezoelectric transducers.

2. The method of claim 1, wherein forming said array of independent piezoelectric transducers comprises:

staking a plurality of substrates having a plurality of conductive tracks;

filling a cavity formed by said substrates with a hardening resin;

cutting the stacked substrates perpendicularly to the axis of the conductive tracks, thereby forming a surface having an array of track sections;

metallizing said surface;

covering the metallized surface with a layer of piezoelectric material; and cutting said layer of piezoelectric material and the metallized surface, thereby forming an array of independent piezoelectric transducers.

3. The method of claim 1, wherein etching said first and second acoustic matching plates is performed with a laser.

4. The method of claim 1, wherein etching said first and second acoustic matching plates comprises:

focusing a laser beam; and guiding said laser beam through a mask.

5. The method of claim 1, wherein etching said first and second acoustic matching plates comprises cutting with an infrared laser beam.

6. The method of claim 1, wherein etching said first and second acoustic matching plates comprises cutting with a laser beam having an energy density that does not affect the conductive electrode.

7. A method of manufacturing a multiple-element acoustic probe, comprising the steps of:

forming an array of independent piezoelectric transducers each attached to a conductive acoustic matching element;

laying a conductive electrode on said array;

bonding said conductive electrode to said array;

covering said conductive electrode with an acoustic matching plate; and etching said acoustic matching plate so that said conductive electrode provides a corrosion barrier to said etching, wherein said etching is performed so as to form an array of acoustic matching elements corresponding to said array of independent piezoelectric transducers each attached to a conductive acoustic matching element.

8. The method of claim 7, wherein forming said array of independent piezoelectric transducers each attached to a conductive acoustic matching element comprises:

staking a plurality of substrates having a plurality of conductive tracks;

filling a cavity formed by said substrates with a hardening resin;

cutting the stacked substrates perpendicularly to the axis of the conductive tracks, thereby forming a surface having an array of track sections;

metallizing said surface;

covering the metallized surface with a layer of piezoelectric material;

covering said layer of piezoelectric material with a conductive acoustic matching plate; and cutting said conductive acoustic matching plate, said layer of piezoelectric material, and said metallized surface, thereby forming an array of independent piezoelectric transducers each attached to a conductive acoustic matching element.

9. The method of claim 7, wherein etching said acoustic matching plate is performed with a laser.

10. The method of claim 7, wherein etching said acoustic matching plate comprises:

focusing a laser beam; and guiding said laser beam through a mask.

11. The method of claim 7, wherein etching said acoustic matching plate comprises cutting with an infrared laser beam.

12. The method of claim 7, wherein etching said acoustic matching plate comprises cutting with a laser beam having an energy density that does not affect the conductive electrode.

* * * * *